(12) United States Patent
Goodman et al.

(10) Patent No.: US 8,420,981 B2
(45) Date of Patent: Apr. 16, 2013

(54) APPARATUS FOR THERMAL PROCESSING WITH MICRO-ENVIRONMENT

(75) Inventors: Daniel Goodman, Lexington, MA (US);
Arthur Keigler, Wellesley, MA (US);
David G. Guarnaccia, Carlisle, MA (US); Matthew R. Jeffers, Exeter, NH (US)

(73) Assignee: Tel Nexx, Inc., Billerica, MA (US)

( * ) Notice: Subject to any disclaimer, the term of this patent is extended or adjusted under 35 U.S.C. 154(b) by 430 days.

(21) Appl. No.: 12/590,852

(22) Filed: Nov. 13, 2009

(65) Prior Publication Data

US 2011/0114623 A1   May 19, 2011

(51) Int. Cl.
*H01L 21/477* (2006.01)
*F27D 11/00* (2006.01)

(52) U.S. Cl.
USPC ............. 219/385; 432/77; 257/E21.497

(58) Field of Classification Search .......... 219/385; 432/77; 257/E21.497
See application file for complete search history.

(56) References Cited

U.S. PATENT DOCUMENTS

| | | | |
|---|---|---|---|
| 5,130,067 A | 7/1992 | Flaitz et al. | |
| 5,252,140 A | 10/1993 | Kobayashi et al. | |
| 6,357,143 B2 | 3/2002 | Morad et al. | |
| 6,365,518 B1 * | 4/2002 | Lee et al. | 438/687 |
| 6,929,774 B2 | 8/2005 | Morad et al. | |
| 7,311,810 B2 | 12/2007 | Mok et al. | |
| 2002/0151154 A1 | 10/2002 | Yamazaki et al. | |
| 2003/0200918 A1 | 10/2003 | Nagashima et al. | |
| 2004/0231585 A1 | 11/2004 | Yamasaki et al. | |

FOREIGN PATENT DOCUMENTS

| | | |
|---|---|---|
| JP | 63-131520 | 6/1988 |
| JP | 01-169293 | 7/1989 |

OTHER PUBLICATIONS

International Search Report mailed Jan. 25, 2011, International application No. PCT/US10/56441, International filed Nov. 12, 2010.

* cited by examiner

*Primary Examiner* — David S Blum
(74) *Attorney, Agent, or Firm* — Rothwell, Figg, Ernst & Manbeck, P.C.

(57) ABSTRACT

A substrate thermal processing system. The system has at least one substrate holding module having a housing configured for holding an isolated environment therein. A substrate heater is located in the housing and has a substrate heating surface. A substrate cooler is located in the housing and having a substrate cooling surface. A gas feed opening into the housing and feeding inert or reducing gas into the housing when the substrate is heated by the heating surface. A gas restrictor is within the housing restricting the fed gas between the substrate heating surface and a surrounding atmospheric region substantially surrounding the substrate heating surface in the housing and forming an aperture through which the fed gas communicates with the atmospheric region.

44 Claims, 14 Drawing Sheets

APPARATUS FOR THERMAL PROCESSING WITH MICRO-ENVIRONMENT

BACKGROUND

1. Field of the Disclosed Embodiments

The disclosed embodiments relate to semiconductor device fabrication, and more particularly to a method and apparatus for processing of semiconductor substrates.

2. Brief Description of Earlier Developments

Integrated circuits are generally built on a silicon wafer base and include many components such as transistors, capacitors and other electronic devices connected by multiple layers of wiring, or interconnect. Most advanced chips are now constructed with copper interconnects, since copper has lower resistivity than aluminum. These interconnects are often multi-level and are formed by filling high-aspect ratio features, such as vias and trenches. These features are filled first with dielectric barrier layers followed by metal seed layers using either physical vapor deposition (PVD) or chemical vapor deposition (CVD). After the seed layer, the interconnect features are filled with copper using electrochemical plating (ECP). This process sequence is used for front-end-of-line applications such as copper damascene interconnects and also for the larger interconnects used in advanced packaging. Alternate process sequences are also under development to eliminate the need for seed layers and allow direct electro-plating on silicon or on barrier materials.

Copper damascene and direct plating processes use one or more anneal steps to improve interconnect properties and to facilitate further processing. Anneal is used to increase electrical conductivity via grain refinement, to reduce via pullout and voids via stress relaxation and to reduce the possibility of failures due to electro-migration. Annealing leaves the copper in a known state, which is necessary for reliable down-stream processing. For example, having a known, uniform state of hardness and grain size is required to achieve stable process control for chemical-mechanical-polishing (CMP), the most common post-plating process step.

Semiconductor annealing can be performed by a variety of equipment. Anneal equipment include ovens, vertical furnaces, rapid thermal processing systems and specialized modules. Furnaces and other dedicated external anneal system have the disadvantage that they require additional wafer handling, as the wafers are transported to the dedicated tool in a specialized carrier. Specialized modules may be directly attached to electro-plating tools. Directly attached modules have the advantage that anneal can be incorporating directly into the electro-plating recipe, and wafers can be annealed one or more times as necessary during plating.

Annealing may be typically done for several minutes at a temperature of 200-400° C. Annealing may be performed in an inert or reducing gas atmosphere to prevent oxidation. The most common atmosphere is nitrogen, although forming gas (a mixture of nitrogen and hydrogen) is sometimes used. Wafers are typically brought to the anneal temperature by placing them close to a heated chuck for a recipe-dependent time. Wafers are then cooled either by natural convection or by contact with a cool surface. They are then returned to a cassette or specialized enclosure and transported to the next processing tool.

Anneal chambers for semiconductor processing may be divided into two types based on their geometry. Vertical anneal chambers have their heating area vertically below their cooling area. Horizontal anneal chambers have their heating area horizontally adjacent their cooling area. A representative vertical geometry anneal chamber with a heating area below the cooling area is described, for example, in U.S. Pat. No. 6,929,774 by Morad et. al. A representative horizontal anneal chamber with a heating area horizontally adjacent to a cooling area is described in U.S. Pat. No. 7,311,810 by Mok et al., both of which are incorporated by reference herein in their entireties.

SUMMARY OF THE EXEMPLARY EMBODIMENTS

In accordance with one exemplary embodiment, a substrate thermal processing system is provided. The system has at least one substrate holding module having a housing configured for holding an isolated environment therein. A substrate heater is provided located in the housing and having a substrate heating surface. A substrate cooler is provided located in the housing and having a substrate cooling surface. An gas feed opening is provided into the housing and feeding inert or reducing gas into the housing when the substrate is heated by the heating surface. A gas restrictor is provided within the housing restricting the fed gas between the substrate heating surface and a surrounding atmospheric region substantially surrounding the substrate heating surface in the housing and forming an aperture through which the fed gas communicates with the atmospheric region.

In accordance with another exemplary embodiment, a substrate thermal processing system is provided. The system has at least one substrate holding module having a housing configured for holding an isolated environment therein. A substrate heater is provided located in the housing and having a substrate heating surface. A substrate cooler is provided located in the housing and having a substrate cooling surface. A gas feed opening is provided into the housing and feeding inert or reducing gas into the housing when the substrate is heated by the heating surface. A gas boundary bounding a first gas region within the housing from a second gas region within the housing is provided, the gas boundary including the substrate heating surface in the first gas region, wherein the first gas region contains the fed gas and the second gas region is substantially atmospheric and wherein the gas boundary has a boundary opening through which the fed gas passes from the first gas region to the second gas region.

In accordance with another exemplary embodiment, a system for semiconductor thermal processing consisting of a plurality of isolated modules is provided. Each isolated module has a substrate heater and an gas source adapted to provide inert or reducing gas flow during substrate heating. A restriction is provided adapted to restrict gas flow between the substrate heater and the surrounding atmospheric environment. A substrate cooler is provided adapted to cool substrates after heating. A substrate transporter is provided adapted to transport substrates from the substrate heater to the substrate cooler.

BRIEF DESCRIPTION OF THE DRAWINGS

The foregoing aspects and other features of the exemplary embodiments are explained in the following description, taken in connection with the accompanying drawings, wherein.

DETAILED DESCRIPTION OF THE EXEMPLARY EMBODIMENT(S)

Figure 1:
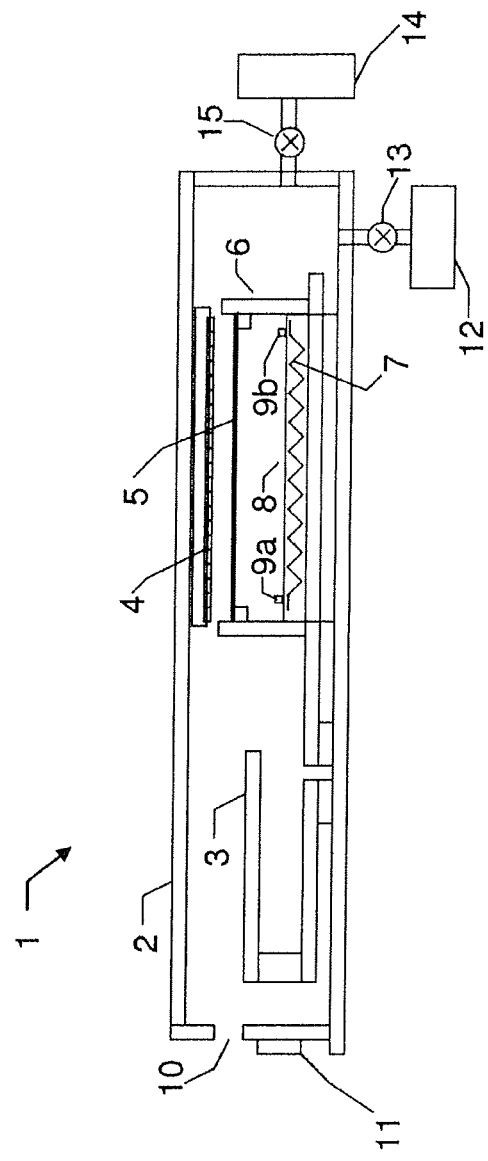
FIG. 1 is a cross-sectional view of a conventional vertical-configuration anneal module.

Referring now to FIG. 1, there is shown a conventional vertical anneal configuration 1 containing a semiconductor wafer 5 undergoing an anneal process. Configuration 1 includes process chamber 2, wafer handler 3, cold plate 4, wafer lift-hoop mechanism 6, heated chuck 8 with embedded resistive heating coils 7, lift pins 9a and 9b, slot valve 10, slot valve cover 11, vacuum pump 12, vacuum pump valve 13, inert gas source 14, and inert gas valve 15. In FIG. 1, the wafer lift-hoop 6 is shown at an intermediate height. Before processing, the hoop would be recessed below the heated chuck 7. Also before processing, the chuck 8 would have reached a temperature set-point by heating of the internal resistive heating coils 7.

Figure 2:
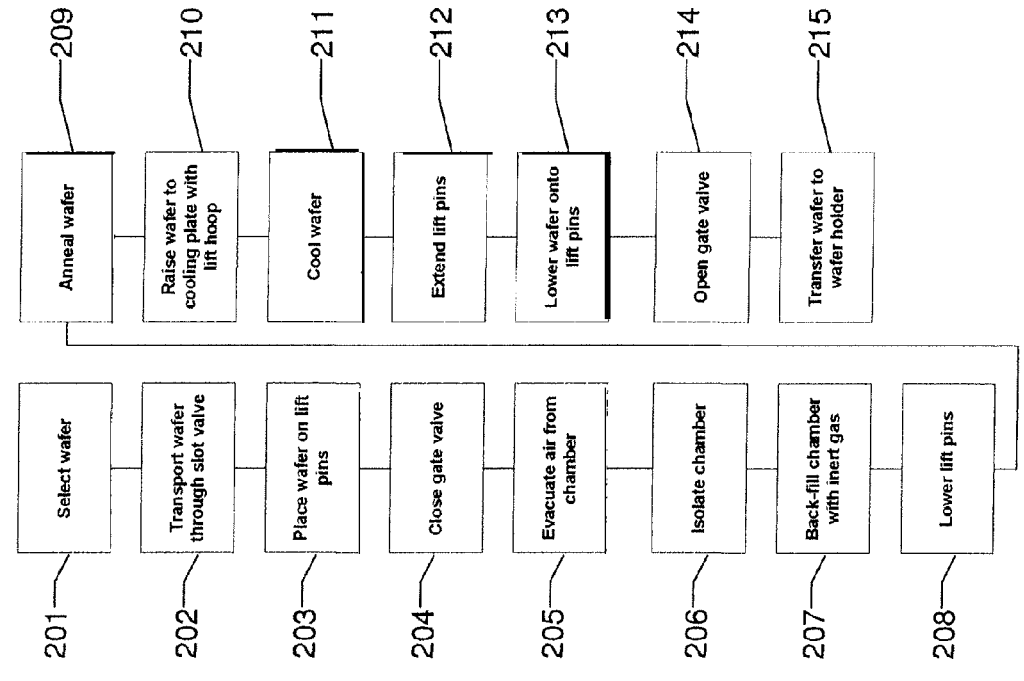
FIG. 2 is a list graphically illustrating a conventional process for operation of a conventional vertical-configuration anneal module in FIG. 1.

Referring now to FIG. 2, there is shown a list graphically illustrating a conventional process when operating vertical anneal configuration 1. The process may include:

201. Select wafer 5 from an internal or external wafer holder (not shown).
202. Transport wafer 5 through the slot valve 10.
203. Place wafer 5 onto wafer lift pins 9a and 9b using the internal wafer handler 2.
204. Close gate valve 10 using slot valve cover 11.
205. Evacuate air from the chamber by opening vacuum valve 13.
206. Isolate chamber 2 by closing valve 13.
207. Back-fill chamber 2 with inert gas by opening valve 15.
208. Lower the lift pins 9a and 9b to allow thermal contact between the wafer and heated chuck 8.
209. Anneal wafer 5 on heated chuck 8 for a set period of time.
210. Raise wafer 5 using the lift-hoop 6 so that the wafer is in close proximity to cooling plate 4.
211. Cool wafer 5 by heat exchange with cooling plate 4 for a set period of time.
212. Extend lift pins 9a and 9b.
213. Lower wafer 5 onto lift pins 9a and 9b using lift-hoop 6.
214. Open gate valve 11.
215. Transfer wafer 5 to an internal or external wafer holder using wafer handler 2.

Figure 3:
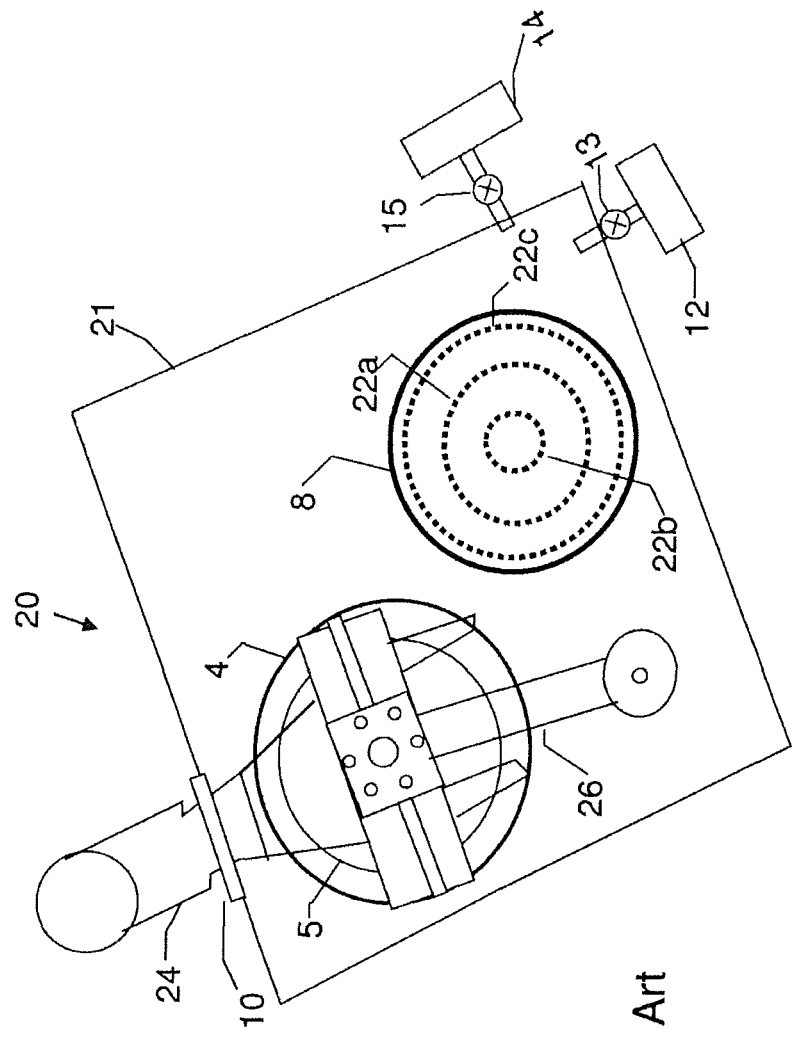
FIG. 3 is a top plan view of a conventional horizontal-configuration anneal module.

Referring now to FIG. 3 there is shown another conventional configuration 20, here a horizontal anneal configuration, containing a semiconductor wafer 5 undergoing an anneal process. Features in horizontal configuration 20 which may perform similar functions as features in vertical configuration 1 are labeled with the same numbers to facilitate comparison. These include the cooling plate 4, heated chuck 8, slot valve 10, vacuum pump 12, vacuum pump valve 13, inert gas source 14, and inert gas valve 15. Other features include external robotic end-effector 24 and vertical spacers 22a, 22b, and 22c. Vertical spacers 22a-c are optionally present in cooling plate 4 as well as hot chuck 8 of vertical anneal configuration 1.

Figure 4:
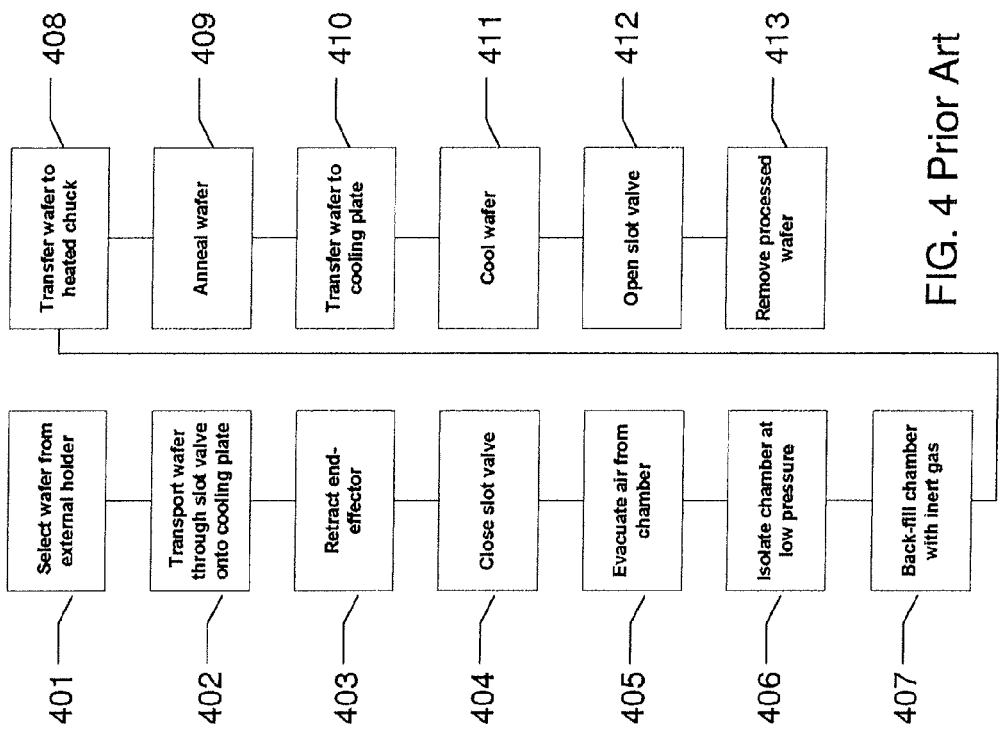
FIG. 4 is a list graphically illustrating a conventional process for operation of a conventional horizontal-configuration anneal module in FIG. 3.

Referring now to FIG. 4, there is shown a list graphically illustrating a conventional process when operating horizontal anneal configuration 20. The process may include:

401. Select wafer 5 from an external wafer holder or processing station (not shown).
402. Transport wafer 5 through a slot valve 10 onto the cooling plate 4 using end-effector 24.
403. Retract end-effector 24.
404. Close slot valve 10.
405. Evacuate air from chamber 21 by opening vacuum valve 13.
406. Isolate chamber 21 at low pressure by closing valve 13.
407. Back-fill chamber 21 with inert gas by opening valve 15.
408. Transfer wafer 5 to heated chuck 8.
409. Anneal wafer 5 on heated chuck 8 for a set period of time.
410. Transfer wafer 5 to cooling plate 4.
411. Cool wafer by heat exchange with cooling plate 4 for a set period of time.
412. Open slot valve 10.
413. Extend end-effector 24 and remove processed wafer 5.

In the embodiments illustrated in FIGS. 1 and 3, the volume of chambers 2 and 21 need be sufficiently large to accommodate a variety of features including wafer handlers 3 and 26 and lift-hoop 6. Since the amount of gas in supply 14, the size of vacuum pump 12 and the evacuation time all scale with the volumes of chambers 2 and 21, it may be desirable to decrease this volume to a smaller size, preferably the minimum size to contain wafer 5. It would be further desirable to eliminate vacuum pump 12, thus decreasing system cost. Pump and back-fill process actions 205-207, 405-407 for configurations 1 and 20 require process time which reduces system throughput. In some cases, these actions are repeated to achieve a sufficiently low level of residual oxygen. It may be desirable to eliminate these actions in order to improve system throughput. Silicon wafers are fragile and easily broken by mechanical pressure. This is especially true for thin wafers, whose thicknesses range from 25-250 um. Thin wafers are increasingly being used for mobile applications, high-power devices, and in applications using through-silicon-vias (TSV). In the embodiment shown in FIG. 1, when wafer lift-hoop 6 raises wafer 5 into close proximity with cooling plate 4, it is possible that slight mis-adjustment in height could cause excessive pressure to be applied to the wafer, causing breakage. Even if the wafer is not broken, a slight contact of wafer 5 against cooling plate 4 can lead to elevated particle counts at the contact area. Elevated particle counts are associated with reduced device yields and are not tolerated in semiconductor processing. To achieve sufficient cooling rates while preventing wafer breakage or introducing particles, lift-hoop 6 must incorporate precise mechanical controls and interlocks. Further, it may be desirable for an anneal chamber to allow close, adjustable thermal contact between the wafer and a cooling plate, without the need for mechanical positioning. It may be further desirable to allow cooling of thin wafers without mechanical contact. Thin wafers are not as rigid as full thickness wafers, and may be bowed by as much as several millimeters due to thin-film and fabrication stresses. A bowed wafer placed on heated chuck 8 will not be in good thermal contact with the chuck over a portion of the wafer surface. As a result, the temperature profile across the wafer may not be sufficiently uniform. It may be desirable for an anneal chamber to easily accommodate processing of thin wafers. Such processing includes the ability to handle thin wafers without breakage as well as ensure a sufficiently uniform temperature profile. Wafer height spacers 22a, 22b and 22c are used to support the wafer during heating. They are also used to set the wafer heating rate and improve the temperature uniformity. In order to prevent particle generation, it would be desirable to prevent such contact, and contact the wafer 5 only at the rim or in an area known as the edge exclusion region. Vertical anneal configuration 1 contains a cold plate 4 directly above the heated chuck 8. Horizontal anneal configuration 20 contains a cooled metal chamber 21 directly above the heated chuck 8. When hot, chuck 8 will lose heat via convective transport to cooled areas. This is true both when the chuck is bare and when a wafer 5 is present on the chuck. At the high temperatures used in annealing, convective heat loss is significantly higher than insulated heat loss. It would be preferable to reduce the heat loss, so as to reduce the heating and cooling costs.

Figure 5:
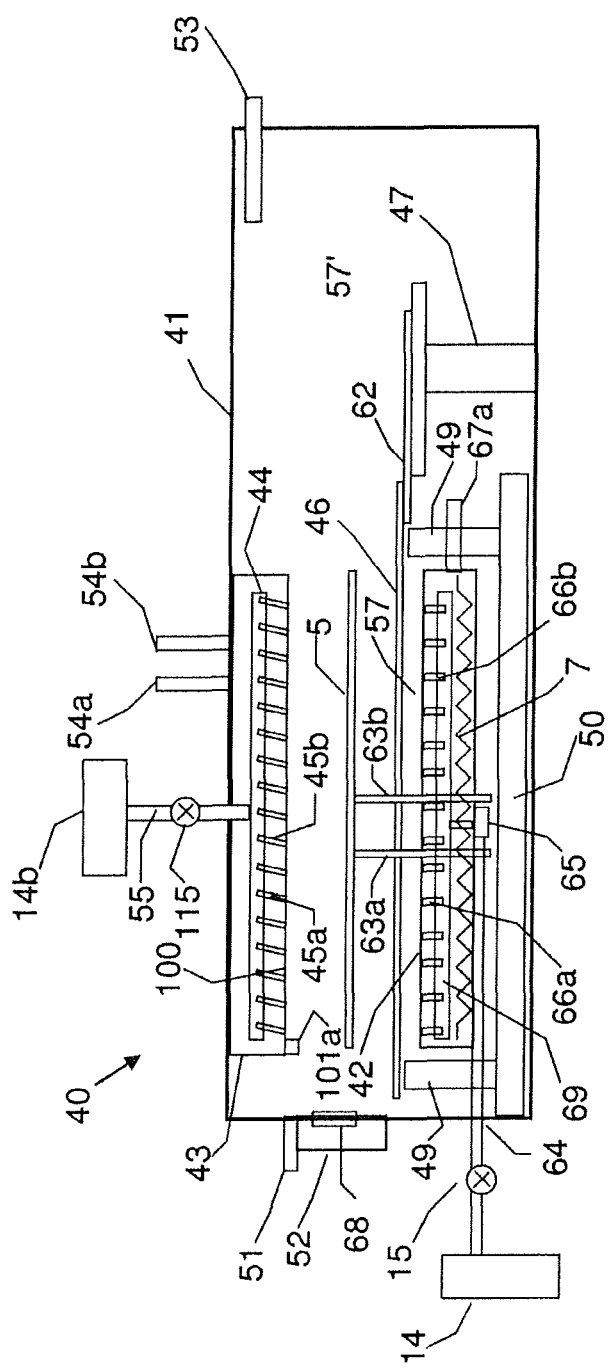
FIG. 5 is a side cross-section view of a semiconductor workpiece process module incorporating features in accordance with an exemplary embodiment of the invention.

Referring now to FIG. 5, there is shown an exemplary apparatus 40 for thermal processing and post-process cooling of a substrate incorporating features in accordance with an exemplary embodiment of the present invention. The apparatus has a gas micro-environment for substrate heating, cooling and to prevent oxidation while using minimal inert or reducing (or other suitable process) gas flow as will be described in greater detail below. Embodiments also use gas flow for substrate handling tasks. Although the present invention will be described with reference to the embodiments shown in the drawings, it should be understood that the present invention can be embodied in many alternate forms of embodiments. In addition, any suitable size, shape or type of elements or materials could be used. Although the exemplary thermal processing system and method is described for exemplary purposes as applied to semiconductor annealing, it should be understood that the scope of the disclosed embodiments are not limited to annealing of semiconductor substrates, as there are other substrate processing applications, for example, such as reflow and degas operations, for which the disclosed embodiments may also be used.

Referring still to FIG. 5, there is shown a side cross-section view of the exemplary semiconductor wafer processing module 40. In the embodiment illustrated in FIG. 5, the processing module is shown for example purposes as an anneal module having what may be referred to as a generally vertical configuration (which means that if the module has both heating and cooling plates, one is below the other). In alternate embodiments, the process module may be any other suitable type of thermal process module. In the exemplary embodiment, the anneal module 40 comprises a housing defining a chamber 41 containing a Bernoulli cooling plate 43 and a heated chuck or plate 42. In alternate embodiments, the module may have either a cooling plate or a heated plate included in the chamber alone or in combination with other wafer processing stations. In other alternate embodiments heating and cooling may be incorporated in a common plate or chuck. As will be further described, the chamber 41 may hold a controlled or isolated atmosphere at substantially atmospheric conditions. Inert or reducing (or other suitable forming or process) gas is fed to Bernoulli cooling plate 43 from inert or reducing gas source 14b through gas inlet 55 when valve 115 is open. As noted, gas source 14b and the gas fed thereby may be inert or reducing gas, and the description hereinafter shall use (for simplicity) the term "inert" when referring to either inert or reducing gas. Inert gas from inlet 55 enters an internal gas distribution manifold 44 which directs gas to a nozzle plate 100 containing nozzle holes, including those labeled 45a and 45b. Cooling water is supplied to and from cooling plate by inlet 54a and cooling water return outlet 54b. Bernoulli cooling plate 43 may contain for example internal water cooling channels, or contain serpentine slots into which copper tubing has been fitted and adhered using thermally conductive epoxy. In alternate embodiments, the cooling plate may have any suitable thermal transfer system for cooling the cooling plate. Cooling plate nozzles, including those shown schematically in FIG. 5 labeled 45a and 45b, directs gas at an angle with respect to nozzle plate 100. In the exemplary embodiment, when a wafer 5 is undergoing cooling by cooling plate 43, gas from nozzle plate 100 is used to maintain the wafer 5 at a known distance with respect to nozzle plate 100 using a process known as Bernoulli chucking. The horizontal component of the gas flow directs the silicon wafer against one or more edge restraints, such as the restraint labeled 101a. In the exemplary embodiment, heated chuck or plate 42 may be surrounded by walls that may be for example thermal insulation including insulating base plate 50, radial insulation 49 and moveable insulating cover 46. Insulating portions 50, 49 and 46 may be fabricated from several layers of stainless steel, and for example may be of thickness between 0.1-0.5 mm, and for example may be spaced apart by a distance of 0.2-0.7 mm, although other high-temperature-capable insulating materials such as alumina, quartz or titanium may be employed. In the exemplary embodiment, heated chuck 42 may contain internal resistive heating coils (not shown) which are fed power by electrical connection 67a though in alternate embodiments any suitable heat exchanger may be used to heat the chuck. In the exemplary embodiment shown a movable cover 46 that may be insulating for example, is attached to cover support 64, which is attached to cover transport assembly 47. A cover transport assembly may move cover 46 from an open position (not shown) into position over the heating zone, although other geometries, such as a linear transport method may also be used. The volume enclosed by wall portions 50, 49 and 46 may be referred to as the heated zone micro-environment (HZM) 57. The diameter of HZM 57, which in the exemplary embodiment has a circular configuration, may be, for example, no more than about 10 mm larger than the diameter of heated chuck 42, which itself may be, for example, no more than about 25 mm larger than wafer 5. In alternate embodiments, the heated chuck and HZM may have any desired dimensions. In the exemplary embodiment, the height of micro-environment 57, which equals the distance between the top of heated chuck 42 and the bottom of cover plate 46 may be, for example, less than about 20 mm and more specifically less than about 10 mm. The gap(s) between walls 49 and movable cover 46 allows inert gas to exit HZM 57 while minimizing the volume of chamber atmosphere that can enter the micro-environment. The vertical gap height between radial insulation 49 and movable insulating cover 46 may be, for example, in the range of about 0.05-0.5 mm, and may be, for example, in the range of about 0.1-0.2 mm, and the overlap width of the gap length, which equals the width of radial insulation 49 may be, for example, greater than about 5 mm and may be, for example, greater than about 10 mm. In the exemplary embodiment, gaps are shown formed at edges between the cover and walls, though in alternate embodiments the cover, walls or both may be porous or ported to allow desired gas flow from HMZ through the cover/walls. Inert gas may be provided by gas source 14 into HZM 57 by inlet tube 64 when regulator valve 15 is opened. In the disclosed embodiment, this gas is fed to heated chuck gas inlet 65 which connects to an internal gas manifold 69 (see FIG. 5)). The gas may then be uniformly distributed into HZM 57 by a set of nozzle holes, such as those labeled 66a and 66b shown schematically in FIG. 5. The gas flow set by regulator valve 15 may be set sufficiently high so that the mean residence time of gas molecules in the micro-environment is minimized, for example, less than about 10 seconds and by way of further example, less than about one second. In the exemplary embodiment, additional means to prevent atmospheric oxygen from entering chamber 41 may include nitrogen air-knife 51, slot valve 68, gate valve 52 and exhaust tube 53. Nitrogen air-knife 51 blows nitrogen downward across the chamber entrance while gate valve 52 is open during wafer exchange. The height of slot valve 68 may be, for example, less than about 12 mm and may be, by way of further example, less than about 6 mm and has a horizontal length of at least about 5 mm. Exhaust tube 53 has a length that may be for example at least 10 times its diameter, thereby preventing atmospheric oxygen from entering chamber 41, as long as a positive inert pressure is maintained. In the exemplary embodiments, the configuration of the cover 46 and wall portions 49 alone or in combination with the interface between heating surface and the wafer form what may be referred to as a gas restrictor within the housing restricting the inert gas between the substrate heating surface and a surrounding atmospheric region 57' substantially surrounding the substrate heating surface. As seen in FIG. 5, portions of cover 46 and wall portions 49 and the substrate heating surface in the housing form an aperture (e.g. via gaps between cover 46 and wall portions 49) through which the inert gas from the HMZ communicates with the atmospheric region 57'. As may be realized, the cover and wall portions define a gas boundary that bounds a first gas region 57 within the housing from a second gas region 57' within the housing. The gas boundary includes the substrate heating surface in the first gas region, where the first gas region 57 contains the inert gas and the second gas region 57' is substantially atmospheric. The gas boundary has a boundary opening, such as gaps 46, 49, through which the inert gas fed through the heating surface when heating a substrate passes from the first gas region to the second gas region as described.

Figure 6:
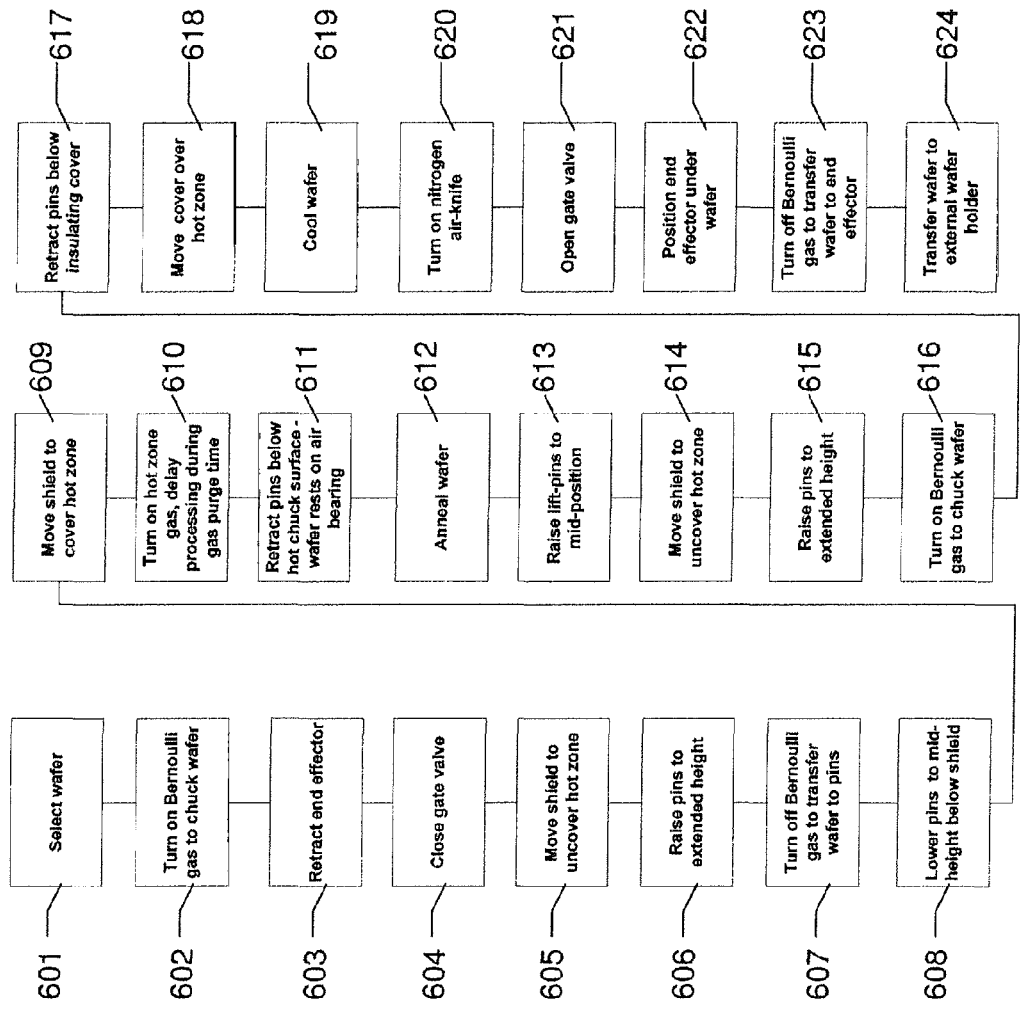
FIG. 6 is a list graphically illustrating an exemplary embodiment of the invention for operation of the exemplary module shown in FIG. 5.

An exemplary process substrate for operating the anneal module 40 having the vertical configuration shown in FIG. 5 is illustrated graphically in FIG. 6. Prior to commencing the process, conditions may be established in the chamber 41, such as the oxygen level in chamber 41 may have been reduced by inert gas flow and heated chuck 42 may have reached a set-point temperature. Valve 15 is open and inert gas flow from source 14 remains on through the process.

Referring now to FIG. 6, there is shown a list of process steps which may include the following actions and which may be accomplished in any suitable order:

601. A semiconductor wafer 5 is selected from a cassette or other external wafer holder (not shown) and transported by an end-effector (not shown) under the Bernoulli cooling plate 43.

602. Valve 115 is opened and inert gas flows through the nozzles in nozzle plate 100 thereby chucking wafer 5 onto Bernoulli cold plate 43.

603. The end-effector is retracted.

604. The gate-valve 52 is closed.

605. Insulating shield 46 is moved, exposing heated chuck 42.

606. Lift pins 63a, 63b are raised to an extended height within a few mm of wafer 5.

607. Valve 115 is closed, and wafer 5 comes to rest on lift pins 63a and 63b.

608. Lift pins 63a, 63b are lowered to a middle position, in which wafer 5 is above the heated chuck 42 but below insulating cover 46.

609. Insulating cover 46 is moved to cover HZM 57.

610. Additional processing is delayed for a recipe-dependent micro-environment purge time.

611. Lift pins 63a, 63b are lowered below the surface of heated chuck 42.

612. Wafer 5 is annealed for a recipe-dependent time.

613. Lift pins 63a, 63b are raised to a mid-position, in which wafer 5 is above the heated chuck 42 but below insulating cover 46.

614. Insulating cover 46 is moved to uncover HZM 57 and wafer 5.

615. Lift pins 63a, 63b are raised to an extended position, in which wafer 5 is within a few mm of Bernoulli cooling plate 43.

616. Open valve 115 in order to chuck wafer 5 onto Bernoulli cooling plate 43.

617. Retract lift pins 63a, 63b below insulating cover 46.

618. Move insulating cover 46 over HZM 57.

619. Wafer 5 is cooled for a recipe-dependent time.

620. Nitrogen air-knife 51 is turned on.

621. Gate valve 52 is opened.

622. An end-effector is extended through gate valve 52 under wafer 5.

623. Valve 115 is turned off and wafer 5 comes to rest on the end-effector.

624. The end-effector transports wafer 5 to a cassette or other external wafer holder for additional processing.

Figure 7:
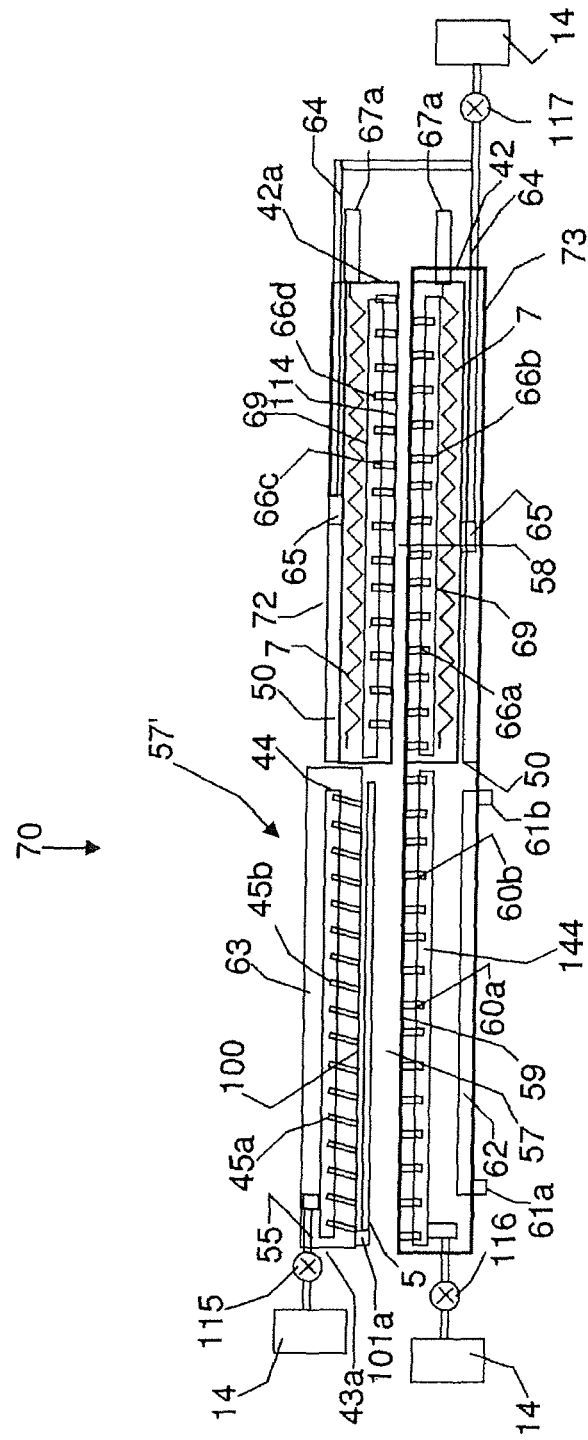
FIG. 7 is a side cross-section view of another exemplary embodiment of a process module.

Referring now to FIG. 7, there is shown a cross-section view of another exemplary semiconductor wafer processing module 70, incorporating features in accordance with another exemplary embodiment. In the embodiment illustrated in FIG. 7, the module 70 is shown for example purposes as an anneal module having what may be referred to as a generally horizontal configuration (which means that if the module has both heating and cooling plates, one is horizontally offset from the other). In alternate embodiments, the process module may have any other suitable configuration. Module 70 may comprise a housing similar to housing 41 shown in FIG. 5, and may be generally similar to module 40 described before except as otherwise noted. Module 70 comprises base assembly plate 73, Bernoulli lift plate 43a, bridge assembly 72, cooling zone micro-environment (CZM) 57, and heating zone micro-environment (HZM) 58. Semiconductor wafer 5 is shown in the module 70. Features may be machined or formed into the base assembly plate 73 to support the CZM include gas nozzles such as those labeled 60a and 60b and embedded heat-transfer cooling tube 62. As noted before, in alternate embodiments, heat transfer may be effected with any suitable heat exchanger. Inert gas is supplied to nozzles 60a and 60b via manifold 144 when valve 116 is open. Cooling fluid is supplied to and from cooling tube 62 via inlet 61a and exit 61b. The base assembly plate 73 also contains features to support thermal insulation 50 and heated chuck or plate 42. In the exemplary embodiment, Bernoulli lift plate 43a includes a nozzle plate 100 and a plurality of angled nozzles including those labeled 45a and 45b as well as cooling tube 63 or other suitable heat exchanger (including active or passive heat exchangers). Inert gas is supplied by gas source 14 to manifold 44 and nozzles including 45a and 45b when valve 115 is open. Bernoulli lift plate 43a is attached to base assembly plate 73, or other portion of the module having via suitable actuators (e.g. pneumatic, not shown), which are activated when the CZM gap is opened to accept an end-effector. In the exemplary embodiment, the Bernoulli lift plate 43a of module 70 has similar functions and features as the Bernoulli cold plate 43 of the module configuration 40 (see FIG. 5), with the additional capability of actuation, such as vertical motion, toward and away from base plate 73. The CZM is maintained with the assistance of inert gas flows from cool-zone base plate nozzles 60a and 60b and from Bernoulli lift plate nozzles 45a and 45b. When the Bernoulli lift plate is lowered, the height of CZM 59 may be for example between about 1-10 mm, and by way of further example between about 1.5-4 mm. The total inert gas flow through valve 115 and 116 may be, for example, between about 2-60 SLM and may be, by way of further example, between about 5-30 SLM. Bridge assembly includes a surface 114 which substantially encloses the top of the HZM. HZM top surface 114 contains nozzles including those labeled 66c and 66d and uses gas flow from these nozzles to creates an upper air-bearing, thereby flattening the wafer. Surface 114 may be thermally insulating surface or it may be the bottom surface of a heated chuck or plate 42a substantially similar to heated chuck 42, but mounted so that the wafer interface surface (e.g. heating surface) faces down or towards the heating plate 42. The HZM 58 is maintained with the assistance of inert gas flows from heated chuck or plate 42 and from surface 114. In the exemplary embodiment, the heated plate 42 may be similar to heated chuck or plate 42 described before and shown in FIG. 5. The HZM 58 in the exemplary embodiment is thus bounded by surface 114 of plate 42a and the wafer interface surface of heated chuck 42 as shown. The height of HZM 58 may be, for example, between about 1 and about 10 mm, and may be by way of further example, between about 1.5-4 mm, and the inert gas flow through valve 117 may be, for example, between about 2-60 SLM and may be by way of further example, between about 5-30 SLM. In the exemplary embodiment, the surface 114 of the HZM 58 is shown as being substantially fixed, though in alternate embodiments, the surface may be movable towards and away from the heated cover with suitable actuators. Similar to module 40, described previously, the CZM 57 and HZM 58, alone or in combination with the interface between the wafer 5 and the interface surfaces that bound the CZM and HZM, form the gas restrictor within the module housing, restricting the inert gas between the wafer interface (e.g. heating, cooling) surface(s) and the surrounding atmospheric region 57' surrounding the wafer interface surface(s). As seen in FIG. 7, the CZM 57 (formed between wafer interface surfaces of lift plate 43a and cold plate that bound the CZM) and the HZM 58 (formed between wafer interface surfaces 114 of heated plate 42, 42a that bound the HZM) form apertures through which the inert gas from the CZM, and/or HZM communicates with the atmospheric region 57'.

Figure 8:
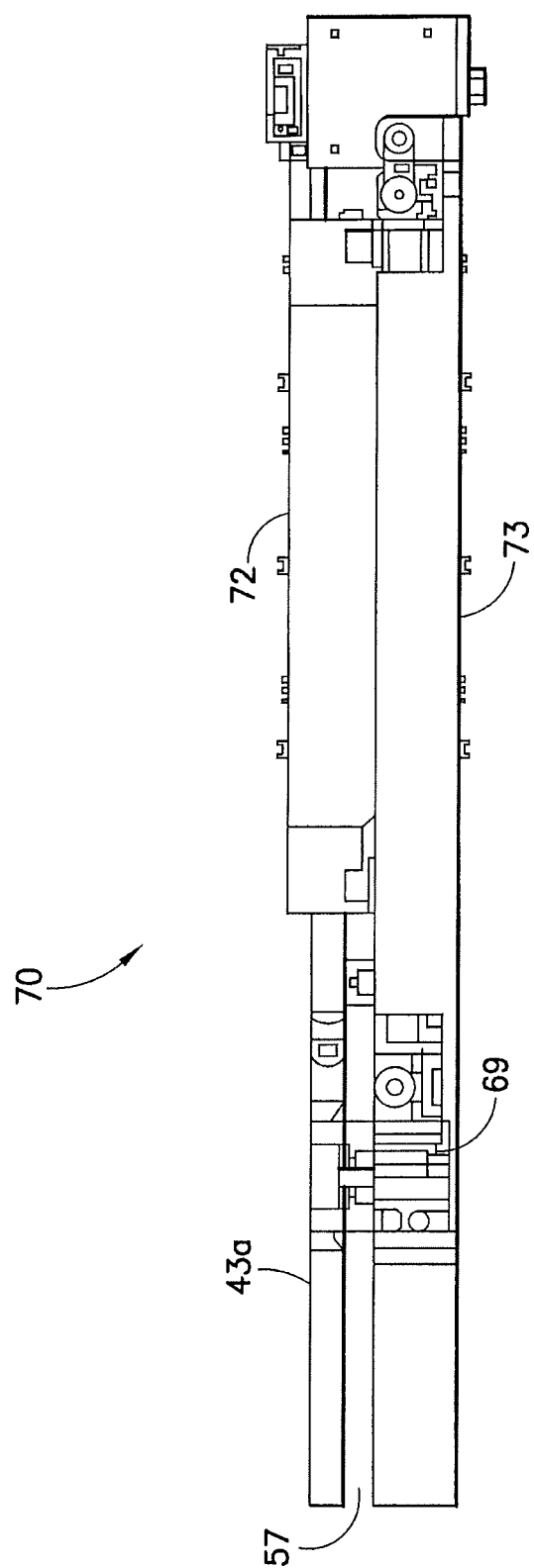
FIG. 8 is an elevation view of the process module in FIG. 7.

Referring now to FIG. 8, there is shown an elevation view of a horizontal anneal module 70. Bernoulli lift plate 43a is raised and lowered by pneumatic actuator assembly 69. The Bernoulli lift plate 43a is shown in a raised position such as may be used during transfer of wafer into CZM 57.

Figure 9:
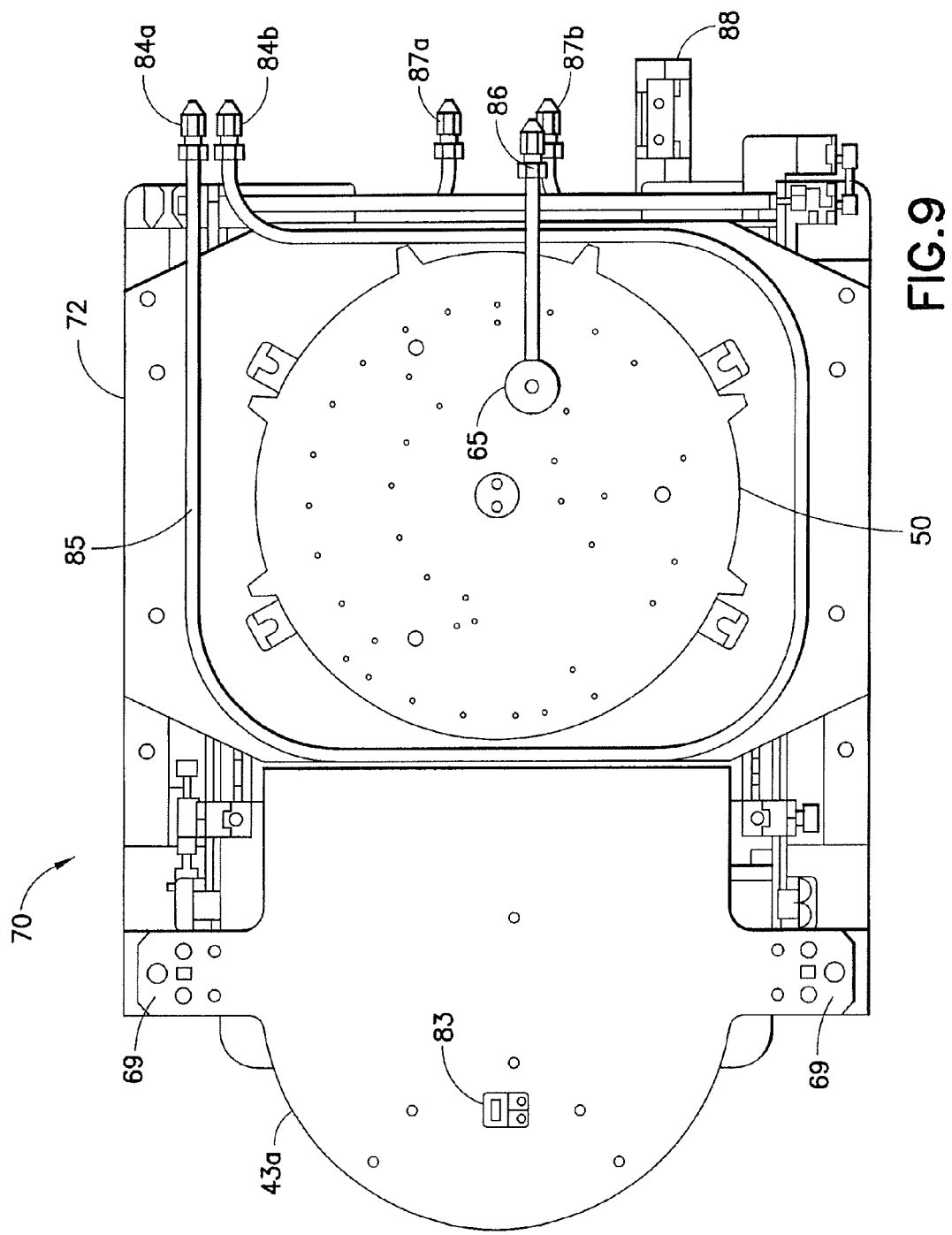
FIG. 9 is a top plan view of the process module in FIG. 8.

Referring now to FIG. 9, there is shown a top plan view of a horizontal anneal module 70. In the exemplary embodiment, Bernoulli lift plate 43a is attached two pneumatic actuator assemblies 69. The configuration shown is exemplary and in alternate embodiments the lift plate may have any suitable configuration including any number of one or more actuators located at any suitable location on the plate and module housing. An optical sensor 83 is mounted within lift plate 43a and senses the presence of a chucked semiconductor wafer. Cooling water is supplied to and from bridge assembly cooling tube 85 via inlet 84a and exit 84b. Cooling water may also be supplied to and from the base assembly 73 via inlet 84a and exit 84b. Electrical signals including wafer position sensing, are communicated to the control system via connector 88.

Figure 10:
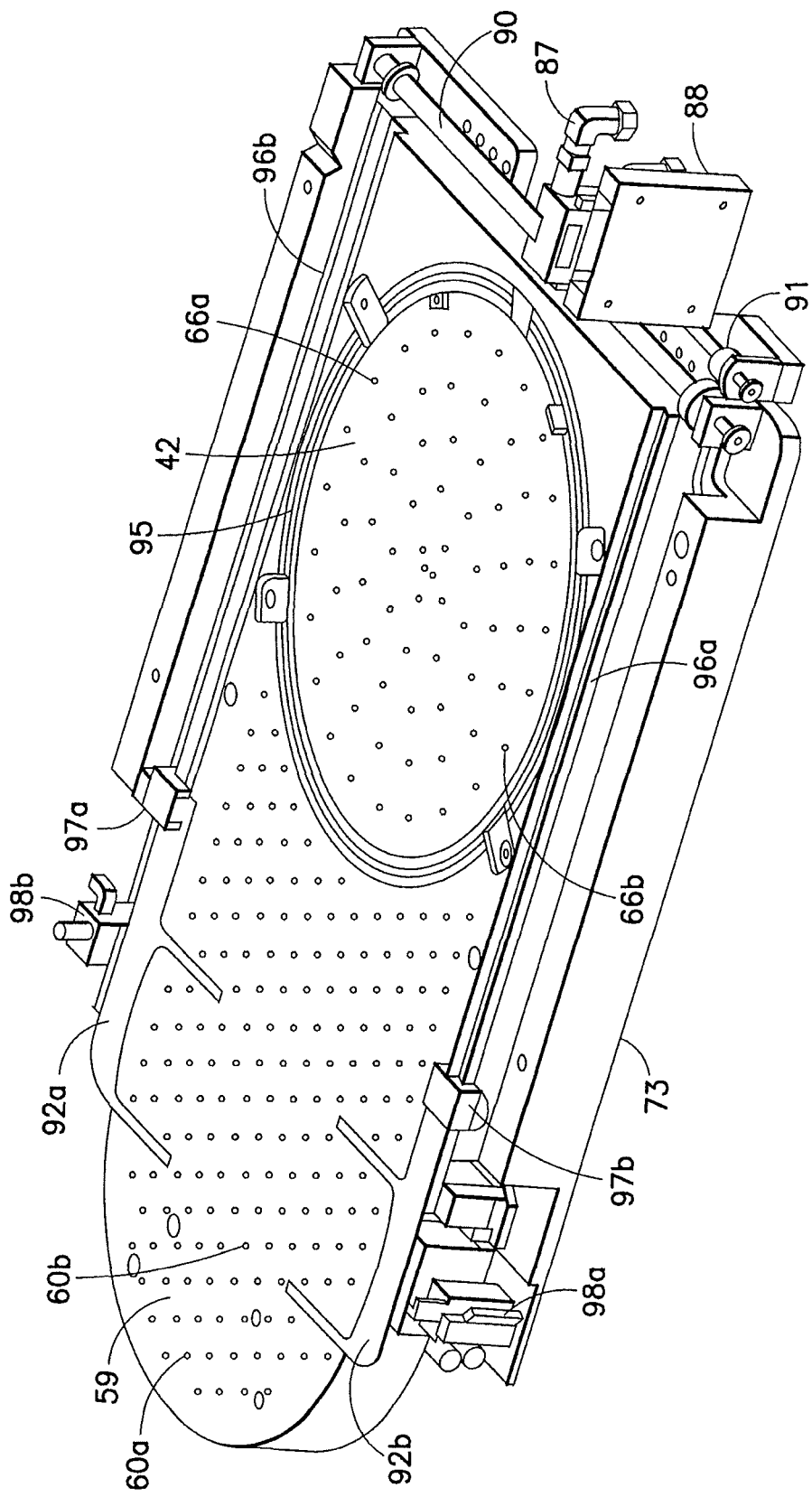
FIG. 10 is a perspective view of an exemplary base plate portion of the process module in FIG. 8.

Referring now to FIG. 10, there is shown a top, perspective plan view of a base assembly 73 illustrating wafer transport features of a horizontal anneal module 70 in accordance with an exemplary embodiment. In the exemplary embodiment, a wafer may be supported during transport, such as between CZM 57 and HZM 58, by an air-bearing. The air bearing transport may be provided by flow from nozzles such as 60a and 60b in the CZM and 66a and 66b in the HZM. In the exemplary embodiment, fingers 92a and 92b may contact the edge of the wafer and guide the wafer between the CZM and the HZM. The fingers 92a and 92b may be guided during movement, such as by being attached to bearing blocks 97a and 97b which are attached to linear rails (not shown). The bearing blocks may also be attached to drives 96a and 96b (for example, by chain drives), which are driven by motor 91 via a suitable transmission (e.g. sprocket gears attached to driveshaft 90).

Figure 11:
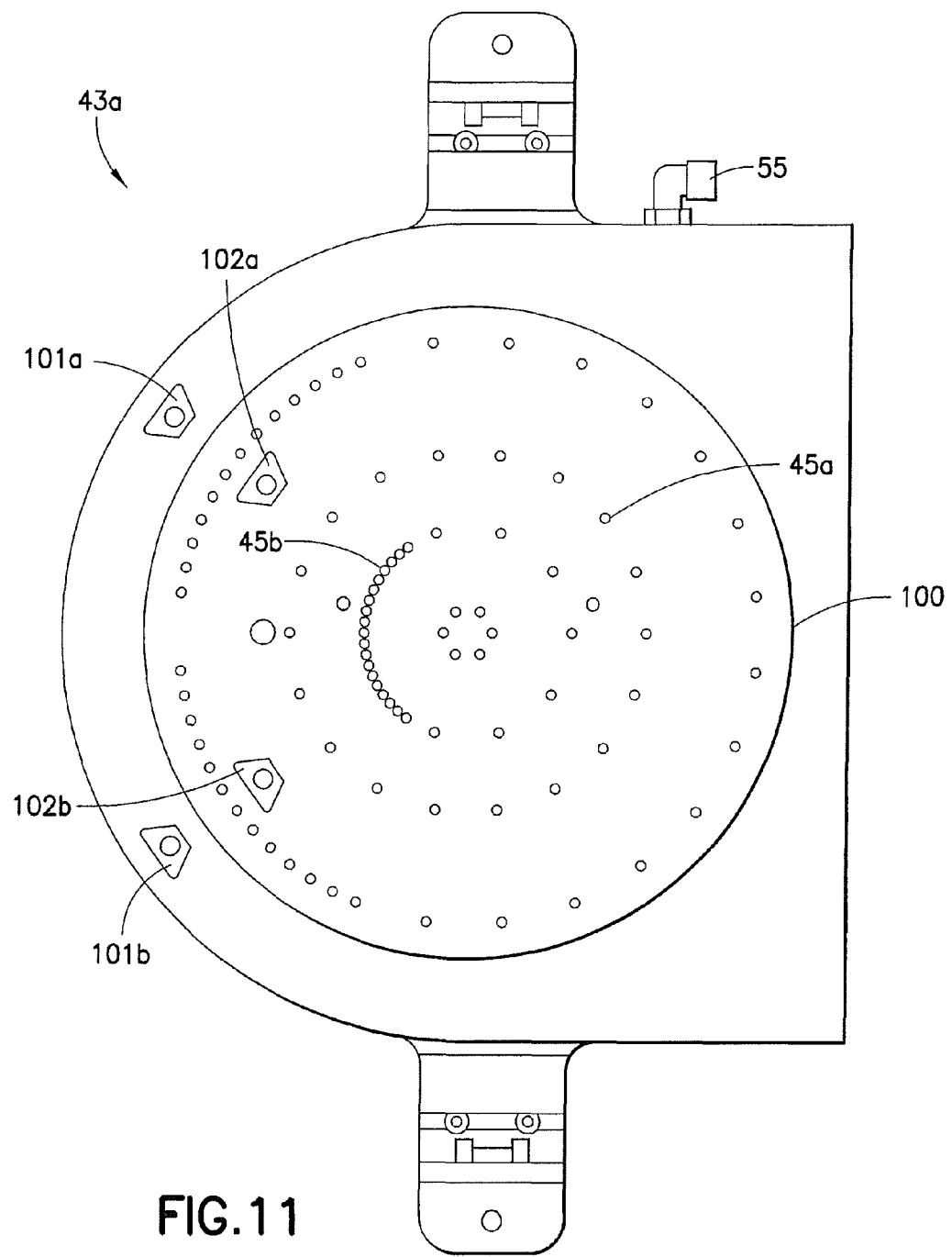
FIG. 11 is bottom plan view of an exemplary cooling plate portion of the process module in FIG. 8.

Referring now to FIG. 11, there is shown a bottom plan view of a Bernoulli lift plate 43a in accordance with an exemplary embodiment. Inert gas may be fed into inlet 55, and exits from nozzle plate 100 via angled nozzles including 45a and 45b (see also FIG. 7). Gas flow directs a chucked wafer against end stop sets 101a and 101b. The end stop position may be variable and is wafer-size dependent, for example end stops 101a and 101b are moved to position 102a and 102b to chuck a smaller wafer. The Bernoulli nozzle plate 100 may be made from titanium although stainless steel or any other suitable material may also be used. For embodiments using a metal nozzle plate, angled nozzle holes 45a and 45b are fabricated using either laser drilling or EDM machining. The Bernoulli lift plate may also be constructed from a porous graphite media, which acts as a filter to prevent particles in the gas stream from reaching the wafer. In this case, the nozzles 45a and 45b are small pores in the graphite surface and the gas exits the porous surface in a direction perpendicular to the surface. The porous media thus creates an air bearing to maintain the wafer at the proper distance from nozzle plate 100, but requires an additional mechanism to maintain the wafer in the proper horizontal location. This horizontal positioning is accomplished by several channels in the wafer edge exclusion region which are provided with vacuum.

Figure 12B:
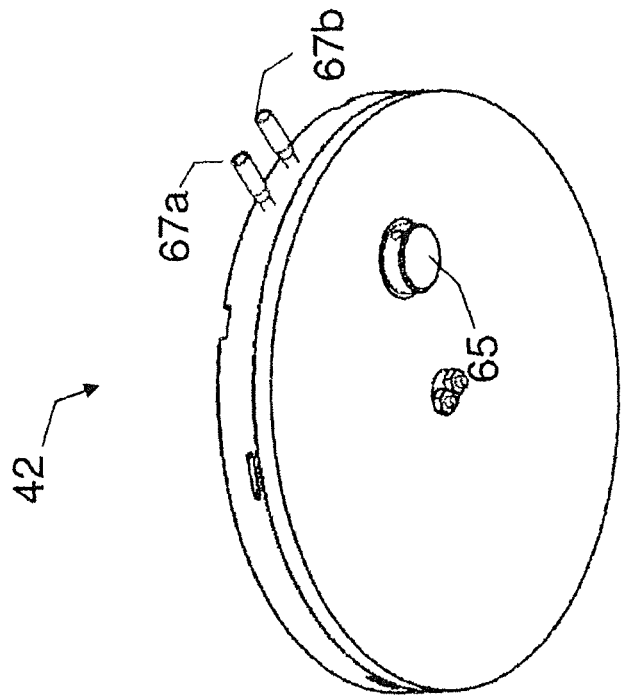
FIG. 12b is a bottom perspective view of the exemplary heated chuck.
Figure 12A:
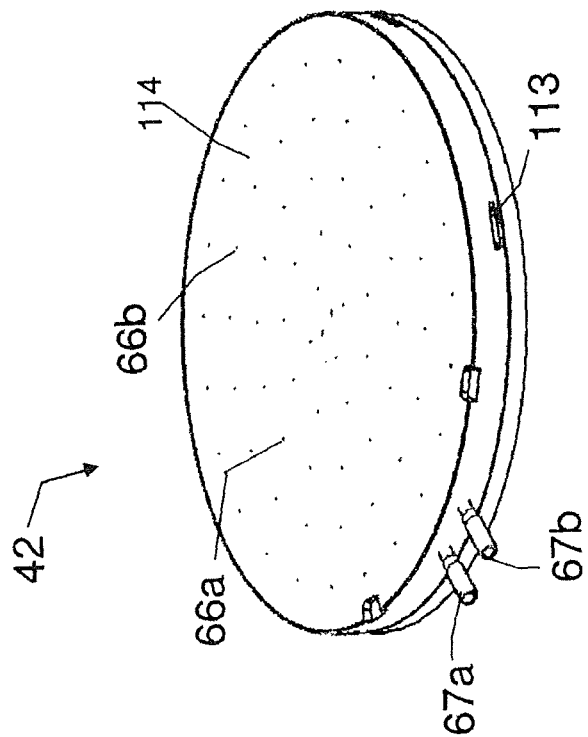
FIG. 12a is a top perspective view of an exemplary heated chuck of either exemplary process module illustrated in FIG. 5 or FIG. 7.

Referring now to FIGS. 12a and 12b, there are shown respectively top and bottom perspective views of a heated chuck 42 of the disclosed embodiment showing electrical connections 67a and 67b, gas inlet 65 and gas nozzles 66a and 66b. Heated chuck 42 may be aluminum which has received a hard anodization (Type III) coating to prevent particle formation or corrosion.

Figure 13:
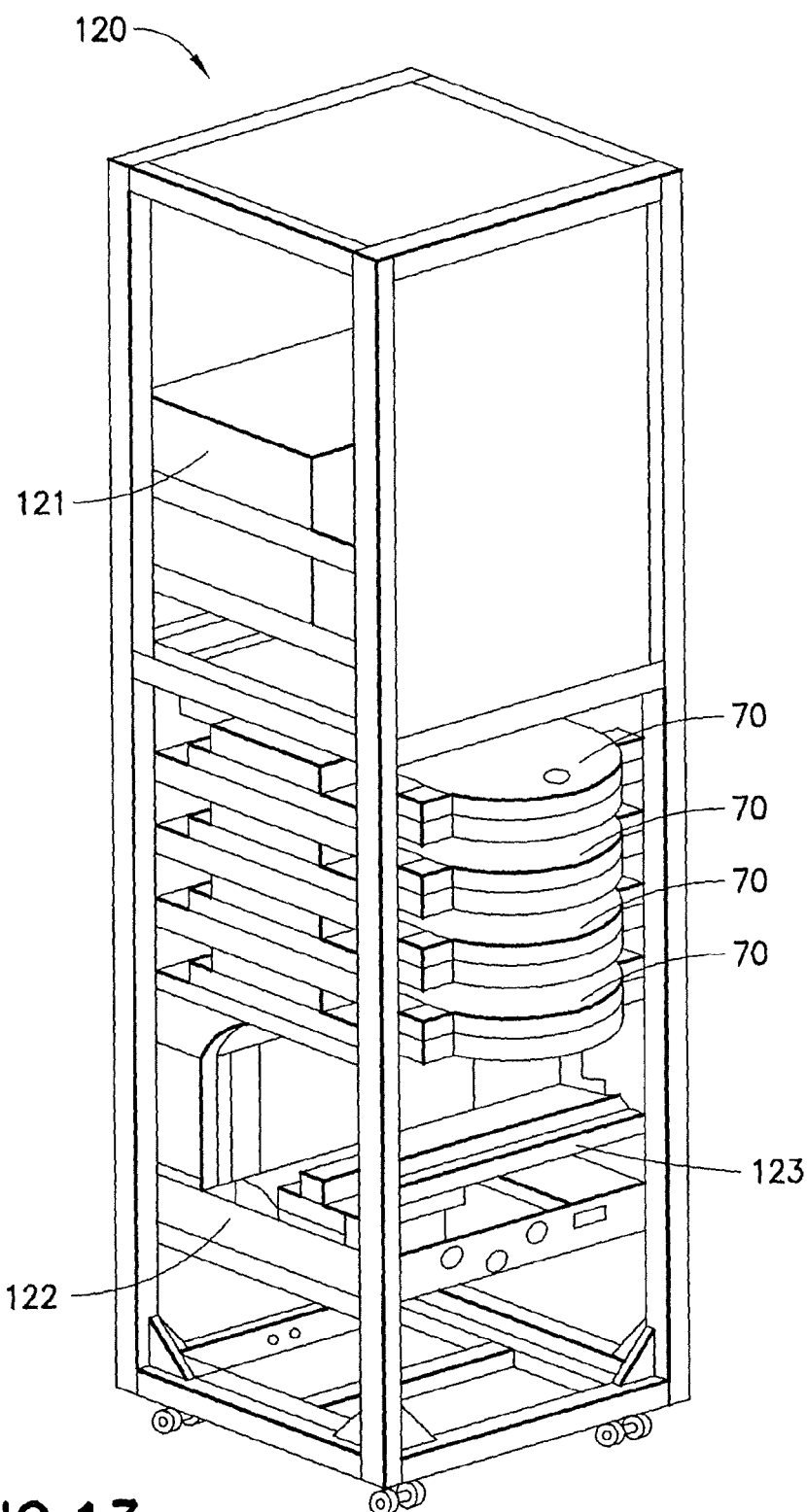
FIG. 13 is a side perspective view of an exemplary processing system incorporating exemplary processing modules similar to the module illustrated in FIG. 7.

Referring now to FIG. 13, there is shown a side perspective view of an anneal system 120 incorporating anneal modules of the disclosed embodiments. Anneal system 120 includes rack-mounted heating control module 121, four vertically-stacked horizontal-configuration anneal modules 70 and facilities interface panel 122. Anneal system 120 can be configured as a stand-alone system or attached to a electro-plating tool using interface features incorporated into alignment assembly 123.

Figure 14:
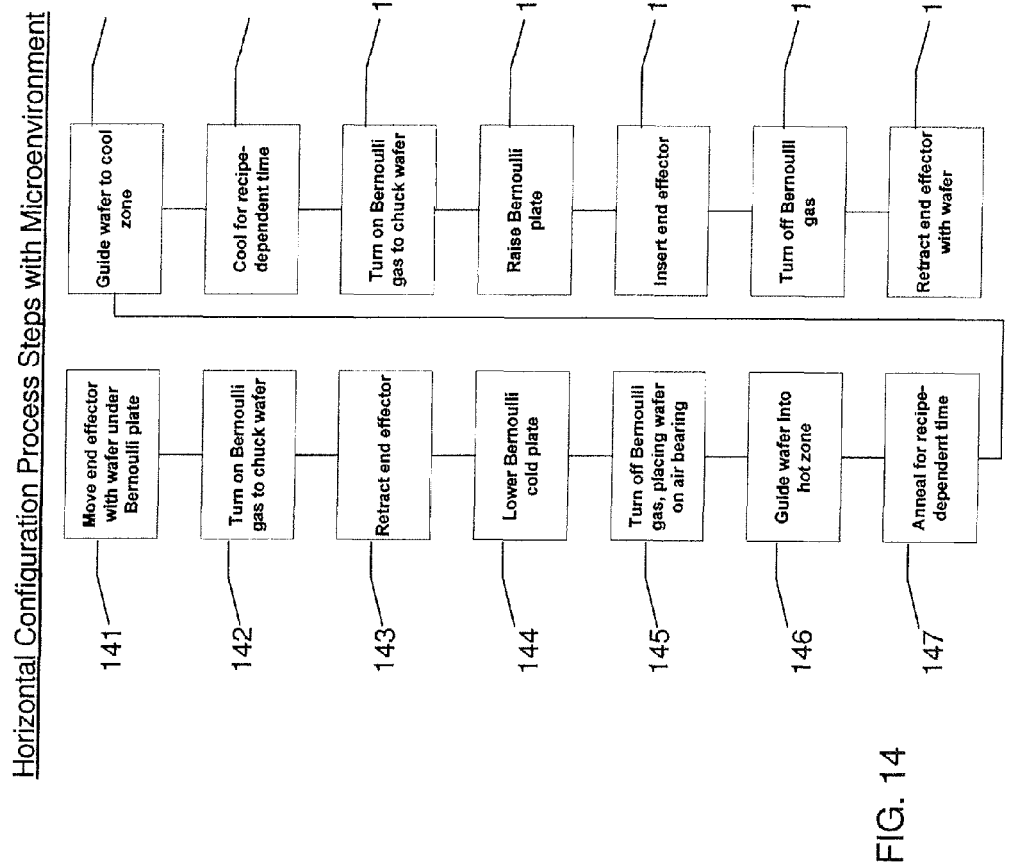
FIG. 14 is a list graphically illustrating an exemplary process for operation of an exemplary process module.

An exemplary process suitable for operating the anneal module 70 having the horizontal configuration is illustrated graphically in FIG. 14. Prior to commencing the process, conditions may be established in the module, such as, the oxygen level in HZM 58 has been reduced by inert gas flow and heated chucks 42 and 42a have reached set-point temperature. Valve 117 is open and inert gas flow from an inert gas source 14 remains on through the process.

Referring now to FIG. 14, there is shown a list of process steps which may include the following actions (which may be accomplished in any suitable order):

141. A semiconductor wafer 5 is selected from a cassette or other external wafer holder (not shown) and transported by an end-effector (not shown) under the Bernoulli lift plate 43a.

142. Valve 115 is opened and inert gas flows through Bernoulli lift plate nozzles including 45a and 45b, thereby chucking wafer 5 onto Bernoulli lift plate 43a.

143. The end-effector is retracted.

144. Bernoulli lift plate 43a is lowered.

145. Valve 115 is closed, placing wafer 5 between transport fingers 92a and 92b.

146. The wafer is guided by transport fingers 92a and 92b from the CZM 57 into the HZM 58.

147. The wafer 5 is annealed for a recipe-dependent time.

148. The wafer 5 is guided by transport fingers 92a and 92b from the HZM 58 into the CZM 57.

149. The wafer 5 is cooled for a recipe-dependent time.

1410. Valve 115 is opened and inert gas flows through Bernoulli lift plate nozzles including 45a and 45b, thereby chucking wafer 5 onto Bernoulli lift plate 43a.

1411. Bernoulli lift plate 43a is raised.

1412. An end-effector is moved under the Bernoulli lift plate 43a.

1413. Valve 115 is closed, placing wafer 5 onto the end-effector.

1414. The end-effector is withdrawn and the wafer is placed into a cassette or other external wafer holder (not shown).

The disclosed embodiments provide an apparatus for thermal processing and cooling of semiconductor wafers. The apparatus incorporates a heated zone micro-environment (HZM). The HZM is a minimal-volume processing environment which prevents wafer oxidation using a continuous minimum quantity of inert gas flow. The apparatus is constructed with an atmospheric, rather than a vacuum-compatible chamber, as the HZM does not require evacuation and gas back-filling in order to achieve a sufficiently low oxygen concentration in a minimal time. Further, the apparatus may not include expensive vacuum pump components. Some embodiments may incorporate an air-bearing cooling plate to maintain the proximity of a substrate to the cooling plate without touching the plate. Other embodiments incorporate a combination Bernoulli and air-bearing plate to position the wafer against retaining fixtures at a fixed distance to the cooling plate, without touching the plate. The air-bearing cooling plate includes inlet means for introducing inert gas, a manifold for distributing the inert gas and a nozzle plate for producing the air bearing. Additionally, the cooling plate includes inlet means for introducing cooling fluid, internal channels to allow thermal heat transfer, and exit means for removing the cooling fluid. Nozzle plates for embodiments incorporating Bernoulli air-bearing plates include angled nozzle-hole patterns to direct a semiconductor wafer against a retaining feature. The air-bearing cooling plate may incorporate a porous media air bearing to provide a uniform air bearing with minimal particle generation. The apparatus may include one or more air bearing heated chucks to maintain the wafer at a fixed distance with respect to the chuck. Further, the heated chuck air bearing provides uniform heating while preventing contact between the wafer and the chuck, thus preventing particle generation. The heated air bearing chuck includes inlet means for introducing inert gas, a manifold for distributing the inert gas and a nozzle plate for producing the air bearing. The heated air bear chuck additionally includes a resistive heater designed in a serpentine pattern, the design of which is optimized to provide uniform surface heating while accommodating the internal inert gas manifold. Some embodiments incorporate both a heated zone microenvironment (HZM) and a cooled zone microenvironment (CZM). These embodiments create the HZM and CZM using a narrow gap to restrict inert gas flow. They may also include air bearing transport means which enable wafer movement between the CZM and HZM. The transport means includes fingers which contact the wafer only in the rim edge exclusion area. The air bearing transport means include a single motion axis, thus reducing cost and complexity. Some embodiments utilize two sets of air bearings, one above the wafer and one below the wafer. Such embodiments have the capacity to flatten and process bowed wafers, and to prevent contact of the wafer with the surfaces which surround the micro-environments.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate thermal processing system comprising:
at least one substrate holding module having a housing configured for holding an isolated environment therein, wherein the isolated environment includes a first gas region and a second gas region;
a substrate heater located in the housing and having a substrate heating surface, wherein the substrate heating surface is located in the first gas region;
a substrate cooler located in the housing and having a substrate cooling surface;
a gas feed opening into the first gas region and feeding inert or reducing gas into the first gas region when the substrate is heated by the heating surface;
a gas restrictor within the housing restricting the fed gas between the first gas region and the second gas region, wherein the gas restrictor includes at least one passage through which the fed gas communicates with the second gas region; and
a substrate transfer device which transfers substrates to and from the first gas region, wherein the substrate transfer device transfers substrates along a transfer path which extends through the second gas region.

2. The system of claim 1, wherein the substrate cooler is located in a position above the substrate heater.

3. The system of claim 1, wherein the substrate cooler is located in a position substantially horizontally adjacent to the substrate heater.

4. The system of claim 1, wherein the substrate heater comprises one or more heated plates, each having at least one resistive heating element positioned in an interior portion of the plate and a plurality of gas nozzles directed toward a substrate receiving surface.

5. The system of claim 1, wherein the substrate cooler comprises a cooled plate in fluid communication with a cooling fluid and a plurality of gas nozzles directed toward a substrate receiving surface.

6. The system of claim 1 wherein the substrate transfer device comprises a substrate transporter having air bearings between the substrate heater and the substrate, and between the substrate cooler and the substrate.

7. The system of claim 1, wherein the fed gas flow is between about 2 and about 60 SLM.

8. The system of claim 1, wherein the substrate cooler is located in the second gas region.

9. The system of claim 8, further including another gas feed opening which feeds inert or reducing gas into said second gas region.

10. The system of claim 9, wherein an exhaust outlet extends from the second gas region, and wherein exhaust gases from the second gas region are exhausted from the system through the exhaust outlet to an external environment, and wherein pressure in said second gas region from gas fed from said gas feed opening and said another gas feed opening is maintained higher than a pressure of said external environment such that a pump is not required to exhaust gases from the second gas region to the external environment.

11. The system of claim 10, wherein the gas restrictor includes a cover movable between an open position and a closed position, wherein in said closed position the cover closes an entry opening into the first gas region, and wherein in said open position said entry opening is open, wherein said substrate transfer device transfers substrates through said entry opening into and out of said first gas region when said cover is in said open position, and further wherein in said closed position said cover at least partially defines said at least one passage through which fed gas passes from the first gas region to the second gas region.

12. The system of claim 11, wherein the at least one passage is defined between the cover and a periphery of the entry opening when the cover is in the closed position.

13. The system of claim 1, wherein the gas restrictor includes a cover movable between an open position and a closed position, wherein in said closed position the cover closes an entry opening into the first gas region, and wherein in said open position said entry opening is open, wherein said substrate transfer device transfers substrates through said entry opening into and out of said first gas region when said cover is in said open position, and further wherein in said closed position said cover at least partially defines said at least one passage through which fed gas passes from the first gas region to the second gas region.

14. A substrate thermal processing system comprising:
at least one substrate holding module having a housing configured for holding an isolated environment therein, said isolated environment including a first gas region and a second gas region;
a substrate heater located in the housing and having a substrate heating surface in the first gas region;
a substrate cooler located in the housing and having a substrate cooling surface in the second gas region;
a gas feed opening into the first gas region and feeding inert or reducing gas into the first gas region when the substrate is heated by the heating surface;
a gas boundary bounding the first gas region within the housing from the second gas region within the housing, the gas boundary including the substrate heating surface in the first gas region, wherein the first gas region contains the fed gas and wherein the gas boundary has a boundary opening through which the fed gas passes from the first gas region to the second gas region; and
a substrate transfer device which transfers substrates to and from the first gas region, wherein the substrate transfer device transfers substrates along a transfer path which extends through the second gas region and substrates pass through the second gas region before entering the first gas region and after exiting the first gas region.

15. The system of claim 14, wherein the substrate cooler is located in a position above the substrate heater.

16. The system of claim 14, wherein the substrate cooler is located in a position substantially horizontally adjacent to the substrate heater.

17. The system of claim 14, wherein the substrate heater comprises one or more heated plates, each having at least one resistive heating element positioned in an interior portion of the plate and a plurality of gas nozzles directed toward a substrate receiving surface.

18. The system of claim 14, wherein the substrate cooler comprises a cooled plate in fluid communication with a cooling fluid and a plurality of gas nozzles directed toward a substrate receiving surface.

19. The system of claim 14, wherein the substrate transfer device comprises a substrate transporter having air bearings between the substrate heater and the substrate, and between the substrate cooler and the substrate.

20. The system of claim 14, wherein the fed gas flow is between about 2 and about 60 SLM.

21. The system of claim 14, further including another gas feed opening feeding inert or reducing gas into the second gas region, and further wherein pressures of the first and second gas regions are maintained by gases flowing through said gas feed opening and said another gas feed opening such that a pressure of said first region is higher than a pressure of said second region and fed gas passes from said first gas region to said second gas region through said boundary opening.

22. The system of claim 14, wherein the gas boundary includes a cover movable between an open position and a closed position, wherein in said closed position the cover closes an entry opening into the first gas region, and wherein in said open position said entry opening is open, wherein said substrate transfer device transfers substrates through said entry opening into and out of said first gas region when said cover is in said open position, and further wherein in said closed position said cover at least partially defines said boundary opening through which fed gas passes from the first gas region to the second gas region.

23. A system for semiconductor thermal processing having a plurality of isolated modules, each isolated module comprising:
a first gas region and a second gas region;
means for heating of a substrate in the first gas region;
a gas source adapted to provide inert or reducing gas flow into the first gas region during heating of the substrate with the means for heating;
means for restricting gas flow between the first gas region and the second gas region;

means for cooling substrates after heating, wherein said means for cooling cools substrates in the second gas region; and a substrate transfer device comprising a substrate transporter adapted to transport substrates from the substrate heater to the substrate cooler through an entry opening of the first gas region, and wherein the means for restricting gas flow restricts gas flow through said entry opening to restrict gas flow from said first gas region to said second gas region.

24. The system of claim 23, wherein the means for cooling is located in a position above the means for heating.

25. The system of claim 23, wherein the means for cooling is located in a position substantially horizontally adjacent to the means for heating.

26. The system of claim 23, wherein the means for heating comprises one or more heated plates, each having at least one resistive heating element positioned in an interior portion of the plate and a plurality of gas nozzles directed toward a substrate receiving surface.

27. The system of claim 23, wherein the means for cooling comprises a cooled plate in fluid communication with a cooling fluid and a plurality of gas nozzles directed toward a substrate receiving surface.

28. The system of claim 27, wherein the cooled plate is made of metal.

29. The system of claim 27, wherein the cooled plate is made of a solid porous media.

30. The system of claim 23, wherein the gas source supplies nitrogen.

31. The system of claim 23, wherein the gas source supplies a combination of nitrogen and hydrogen.

32. The system of claim 23, wherein the fed gas has a residence time less than about 10 seconds.

33. The system of claim 23, wherein the fed gas has a residence time less than about 1 second.

34. The system of claim 23, wherein the substrate transporter comprises a plurality of lift pins.

35. The system of claim 23, wherein the means for restricting gas flow includes a nitrogen air-knife.

36. The system of claim 23, wherein the means for restricting gas flow includes a large-aspect-ratio pipe.

37. The system of claim 23, wherein the means for restricting comprises a narrow channel between the first gas region and the second gas region.

38. The system of claim 37, wherein the narrow channel has a height between about 1.5 and about 10 mm.

39. The system of claim 23, wherein the fed gas flow is between about 2 and about 60 SLM.

40. The system of claim 23, wherein the fed gas flow is between about 5 and about 30 SLM.

41. The annealing system of claim 23, wherein the substrate transporter comprises air bearings between the substrate heater and the substrate, and between the substrate cooler and the substrate.

42. The annealing system of claim 41, wherein the substrate transporter further includes guide fingers, and wherein the substrate is guided over the air bearings by the guide fingers, and wherein the guide fingers contact the substrate only at the substrate edge.

43. The system of claim 23, wherein the means for restricting gas flow includes a cover movable between an open position and a closed position, wherein in said closed position the cover closes the entry opening into the first gas region, and wherein in said open position said entry opening is open, wherein said substrate transfer device transfers substrates through said entry opening into and out of said first gas region when said cover is in said open position, and further wherein in said closed position said cover at least partially defines at least one passage through which fed gas passes from the first gas region to the second gas region.

44. The system of claim 43, in which a vertical gap between the moveable cover and a periphery of the entry opening is between about 0.05 and about 0.5 mm and an overlap of the moveable cover over the periphery of the entry opening is greater than 5 mm, and wherein the vertical gap between the cover and the periphery of the entry opening provides said at least one passage.

* * * * *